United States Patent [19]
Ohmi et al.

[11] Patent Number: 5,149,378
[45] Date of Patent: Sep. 22, 1992

[54] TUNGSTEN FILM FORMING APPARATUS

[75] Inventors: Tadahiro Ohmi, Sendai; Nobuhiro Miki, Osaka; Matagoroh Maeno, Izumi; Hirohisa Kikuyama, Nara, all of Japan

[73] Assignee: Hashimoto Kasei Kabushiki-Kaisya, Osaka, Japan

[21] Appl. No.: 613,730

[22] PCT Filed: Apr. 4, 1990

[86] PCT No.: PCT/JP90/00456
§ 371 Date: Nov. 21, 1990
§ 102(e) Date: Nov. 21, 1990

[87] PCT Pub. No.: WO90/12418
PCT Pub. Date: Oct. 18, 1990

[30] Foreign Application Priority Data
Apr. 10, 1989 [JP] Japan .................. 1-090226

[51] Int. Cl.$^5$ ............................................. C23C 16/00
[52] U.S. Cl. ...................................... 118/725; 427/253; 427/255.1
[58] Field of Search ................. 118/715, 725; 427/253, 427/255.1

[56] References Cited
U.S. PATENT DOCUMENTS
5,009,963  4/1991  Ohmi .................................. 118/726

FOREIGN PATENT DOCUMENTS
62-230981 10/1987 Japan .
63-206473  8/1988 Japan .

Primary Examiner—Richard Bueker
Attorney, Agent, or Firm—Baker & Daniels

[57] ABSTRACT

A tungsten film forming apparatus includes a reaction chamber, means for introducing $WF_6$ into said reaction chamber, and means for introducing $H_2$ gas into said reaction chamber, wherein at least the portion of at least said reaction chamber is made of the metal material whose surface is covered with the fluorinated paasivation film mainly consisting of the almost stoichiometric metal fluoride. It becomes possible to form a high quality tungsten film at a low substrate temperature by use of said tungsten film forming apparatus.

20 Claims, 2 Drawing Sheets

TUNGSTEN FILM FORMING APPARATUS

TECHNICAL FIELD

The present invention relates to a tungsten film forming apparatus.

BACKGROUND OF THE INVENTION

The prior art relating to this invention will be explained by using the example of FIG. 1 where, in order to make an electrical contact with source or drain n+ regions 82 of an MOS LSI formed on a p type Si substrate, contact holes 85 are formed in an insulating film 81 such as $SIO_2$, and then tungsten (W) electrodes are attached to the surface of n+ regions 82 located inside contact holes 85.

As a method for manufacturing the W electrodes, the method that by introducing $WF_6$ and $H_2$ gases into a reaction chamber, W electrodes are formed on surface 84 of n+ region 82 according to the following equation:

$$WF_6 + 3H_2 \rightarrow W + 6HF \ldots \quad (1),$$

has been examined.

The reaction shown as (1) is thought to proceed in such a manner that deposited tungsten works as a catalyst, and the $WF_6$ is reduced by $H_2$ as it is adsorbed by the W. Therefore, this reaction is thought to proceed swiftly only in the case in which W has been deposited thicker than some particular thickness and the surface of the metal is kept pure. If the surface of W is not pure, the substrate must be heated to a temperature higher than 600° C. in order for the reaction (1) to proceed. However, when the temperature of the substrate is increased, not only is the quality of the deposited W film reduced because the size of the crystal grain becomes large, but the chance of the formation of an undesired film is also increased as a result of a reaction between tungsten and impurities.

Figure 1:
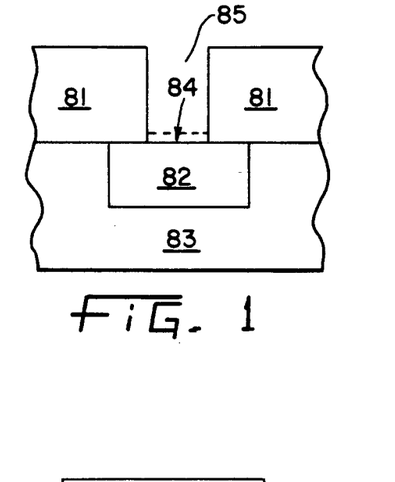
FIG. 1 is a schematic representation illustrating MOS IC on which the film is formed by using the apparatus of the present invention.

In addition, in the case of the example of FIG. 1, it is necessary to deposit the W film only on the surface of the Si located inside contact holes 85 without depositing it on insulating film 81. For that process to occur, the surface of n+ region 82 is required to be pure semiconductor. The reason is as follows.

The initial deposition of the W is thought to occur selectively only on the semiconductor surface according to the following reduction reaction $$2WF_6 + 3Si \rightarrow 2W + 3SiF_4 \ldots \quad (2)$$

after $WF_6$ is adsorbed by Si surface 84 of n+ region 82. Therefore, if some other compounds are formed on the surface of n+ region and thus the pure semiconductor surface is not preserved, the reaction (2) will not proceed swiftly and, in other words, the selective deposition will not occur.

In order to keep the surface pure, it is important not to allow impurities, especially $H_2O$, $O_2$, and hydrocarbons such as $CH_4$ to exist in the reaction chamber. When the structure shown in FIG. 1 is adapted to an ultra high integration of LSI, the concentration of these impurities must be suppressed less than several ppb.

However, there exist at the present time no apparatuses which attain such a high purity atmosphere in the reaction chamber. Namely, in the prior art W film forming apparatus, organic materials which are corrosion-resistant to $WF_6$ are used for the piping system, and metal materials such as stainless steel are used for the reaction chamber. As a result, a large amount of impurities from several ppm to several hundreds ppm, mainly consisting of moisture and hydrocarbons are released from the organic materials. These impurity gases are mixed with source gases, which causes various problems as shown by the following examples.

1) When the moisture adheres to the metal materials of the reaction chamber, the following reaction occurs and products such as a gas cause a secondary contamination, $$M + H_2O \rightarrow MO + H_2.$$

Here, M represents the metal material used for the reaction chamber.

2) When the source gas $WF_6$ reacts with moisture, HF is generated according to the reaction, $$WF_6 + H_2O \rightarrow WOF_4 + 2HF.$$

The surface of the reaction chamber is corroded by HF, and undesirable gases such as oxygen are produced. This case also causes a secondary contamination.

These types of secondary contamination do harm to the semiconductor devices. For example, if $H_2O$ and $O_2$ is adsorbed by the surface of the n+ region 82, the surface 84 will be oxidized. In the case where the substrate is silicon, $SiO_2$ will be formed on the surface of the n+ region. Consequently, a) Selective deposition between the insulating film 81 and the surface 84 of n+ region 82 will not be obtained.

b) The reactions shown in (1) and (2) will not proceed at low temperature. In order for the reactions to proceed, the substrate needs to be maintained at a temperature higher than 600° C. However, in this case, the grain size of crystal in the W film gets large, and the film quality therefore deteriorates.

If $H_2O$ or $O_2$ is adsorbed by the insulating film, the site where $H_2O$ or $O_2$ is adsorbed serves as a source of nucleation in a deposition process, and the W film results even on the insulating film. Namely, the selectivity of deposition between n+ region 82 and insulating film 81 will be lowered.

Furthermore, when $WF_6$ gas of low grade is used, which gas, for example, usually includes more than 10 ppm of moisture, $WF_6$ reacts with $H_2O$, generating HF which is extremely reactive, and HF thus generated corrodes not only metal but also polyimides and CTFE which are used for, for example, the seat of a valve and the conductance controller of a regulator. As a result, the purity of the source gas is decreased still more.

For these reasons, the W films manufactured by using the prior art technologies are of poor quality, and the specific contact resistivity value of the film is as high as $10^{-4}$ to $10^{-5}$ ohm/cm2.

In addition, the W film deposits on the insulating film as well as on the surface of Si. Thus, another aim to form the W film only on the Si surface located inside the contact holes has not been attained.

SUMMARY OF THE INVENTION

The first aim of this invention is to provide a tungsten film forming apparatus comprising a reaction chamber, means for introducing $WF_6$ into the reaction chamber, and means for introducing $H_2$ into the reaction chamber, wherein at least that portion of the reaction chamber which is to be in contact with $WF_6$ is made of metal materials whose surface is covered with a fluorinated passivation film consisting mainly of an almost stoichiometric metal fluoride.

The second point of this invention is to provide a tungsten film forming apparatus according to the first aim, which includes a means for introducing $F_2$ gas into the reaction chamber.

Operation

The structure and operation of this invention will hereinafter be described in detail.

The most striking characteristic of this invention is that the fluorinated passivation film mainly consisting of metal fluoride which is an almost stoichiometric amount, is formed at least on that portion of the interior wall of the reaction chamber which is to be in contact with $WF_6$. It is obvious that this fluorinated passivation film can be formed on portions other than that which is to be in contact with $WF_6$ inside the reaction chamber.

This passivation film has been found by the present inventors to have extremely good corrosion-resistance to $WF_6$ and to release little impurity gas.

The material on which the fluorinated passivation film is formed is a metal or a metal alloy; for example, nickel, nickel alloy, aluminum, aluminum alloy, copper, copper alloy, stainless steel, cobalt, cobalt alloy, titan, titan alloy, and other metals and metal alloys. It is also possible that after forming a metal layer or a metal alloy layer by the use of appropriate layer forming means such as plating, evaporation, and sputtering, on the surface of appropriate materials including, for example, ceramics, the fluorinated passivation film is formed on the surface of the metal or the metal alloy layer. It should be noticed that for purpose of this disclosure all materials whose surfaces are covered with a metal or a metal alloy layer will hereinafter be referred to as metal materials.

Among the metals and the metal alloys mentioned above, aluminum and aluminum alloy are particularly suitable because they are inexpensive, and the passivation film which mainly consists of an almost stoichiometric metal fluoride is very corrosion-resistant as compared with the other metal and metal alloy materials. On the other hand, aluminum and aluminum alloy are readily oxidized and have an oxidized passivation film on their surface. The corrosion-resistance of the fluorinated passivation film formed on the oxidized passivation film is lower than that formed on the pure aluminum or aluminum alloy. Therefore, it is preferable to form the fluorinated passivation film without exposing the surface to atmosphere, i.e., maintaining the pure aluminum and aluminum alloy surface after the aluminum or aluminum alloy layer is formed in a high purity of atmosphere by a method such as sputtering.

The methods to form fluorinated passivation film are described in Japanese patent applications, "Metal materials with fluorinated passivation film and the apparatus using these metal materials," submitted on Jul. 20, 1988 and "Metal materials with fluorinated passivation film and the apparatus using these materials," submitted on Jan. 13, 1989. The formation of the fluorinated passivation film, for example, is carried out by following method.

First, the natural oxidation film is removed from the surface of the metal material. Second, the metal material is baked in a high purity atmosphere of inert gas so that the adsorbed impurities such as moisture will be desorbed from the metal surface. It is preferable that the impurity content of the inert gas is less than several ppb. The fluorinated passivation film is then formed on a portion of the surface or on the entire surface of the metal material, and is then annealed in ultra high purity atmosphere of inert gas whose impurity content is less than several ppb is preferable.

The selected baking temperature is a matter of design choice provided that adsorbed moisture can be removed from the metal surface. For example, in the case of stainless steel, nickel, nickel alloy, copper, copper alloy, chromium, cobalt, cobalt alloy, titan, and titan alloy, a temperature 350° through 600° C. is desirable and 400° through 600° C. is preferable.

The preferable baking time is 1 through 5 hours. At a temperature lower than 350° C., the adsorbed moisture cannot be removed completely from the metal surface. Therefore, if the metal is fluorinated under such condition, for example, in the case of Ni where the formed fluorinated passivation film may be composed of the $NiF_2 \cdot 4H_2O$, a complete fluorinated passivation film which is a stoichiometric amount may not be obtained. In the case of aluminum and aluminum alloy, the baking temperature 150° through 400° C. is desired, and the temperature 200° through 300° C. is favorable.

As for the fluorination, a temperature 200° through 500° C. is desirable and a temperature 250° through 450° C. is preferable for nickel, Monel, copper, copper alloy, and chromium. A fluorination time of 1 through 5 hours is preferable. At a temperature lower than 200° C., the fluorinated passivation film which is thick enough and has excellent corrosion-resistance may not be obtained in some cases. In addition, when the fluorination of metals is carried out at a temperature higher than 450° C., e.g., nickel, the crystal grain of nickel fluoride may be generated in the fluorinated passivation film, which may cause cracking and flaking off of the film. The fluorination temperature for Hastelloy C of 150° through 300° C. is desirable and 150° through 250° C. is preferable. When the fluorination is carried out at a temperature higher than 300° C., an excellent corrosion-resistant passivation film may not be obtained because of flaking off of the film.

In the case of stainless steel, the desirable temperature range for fluorination is 100° through 300° C. although a preferable temperature range is 150° through 265° C. The time for fluorination is 1 through 5 hours. At a temperature equal to or lower than 265° C., $FeF_2$ is generated. On the other hand, $FeF_3$ is generated at a temperature higher than 265° C. If a large amount of $FeF_3$ is generated, the formed film may expand and result in cracking and flaking off of the film because the bulk density of $FeF_2$ is 1.16 times that of $FeF_3$. At a temperature lower than 100° C., a sufficiently thick film cannot be obtained. In the case of aluminum and aluminum alloy, the desirable fluorination temperature range is 200° through 400° C., and preferable range is 250° through 350° C. When the fluorination is carried out at a temperature higher than 400° C., the crystal grain of aluminum fluoride is generated in the film and causes cracking and flaking off of the film.

It is preferable that the fluorination be carried out at atmospheric pressure. However, the fluorination can also be carried out under increased pressure which is less than about 2 atms in gauge pressure. It is preferable to carry out the fluorination in the atmosphere free from oxygen. Therefore, the preferable atmosphere consists of only fluorine or fluorine diluted by appropriate inert gas such as $N_2$, Ar, He, and so forth.

According to the ESCA analysis on the fluorinated passivation film formed at the temperature described above with the aid of Surface Science Instruments' Product Model SSX-100 ESCA spectrometer, the atomic ratio of F to Ni was found to be 1.1 times as large as the stoichiometric ratio of $NiF_2$. In other words, F exists in excess by a factor of 1.1 as compared to Ni. The excess F does not bond with Ni but exists without restriction in the passivation film. This film cannot be a corrosion-resistant material because the resistance to corrosion is inhibited by the excess F. All passivation films which have been reported up to now are the ones that include such excess F, and have not corrosion-resistance property at all.

As for a annealing treatment after the fluorination, a temperature range of 300° through 600° C. is desirable, and a range of 400° through 500° C. is preferable for nickel, nickel alloy, copper, copper alloy, and chromium. In the case of stainless steel, a temperature range of 200° through 600° C. is desirable and a range of 300° through 500° C. is preferable. And in the case of aluminum and aluminum alloy, a range of 200° through 400° C. is desirable, and a range of 250° through 400° C. is preferable. By annealing the fluorinated passivation film in inert gas such as $N_2$, Ar, and He for one through five hours, the almost stoichiometric passivation film is obtained which is durable, dense, and highly adhesive to metal and has sufficient corrosion-resistance. It is a surprising phenomenon and has not been recognized up to now that the quality of the passivation film can be thus improved by the annealing treatment. By examining the change of the film quality with the aid of ESCA, it was found that the ratio of the metal atoms to the fluorine atoms in the fluorinated passivation film almost coincided with stoichiometric ratio of metal fluoride after the annealing treatment. The thickness of the fluorinated passivation film was measured with a Shimazu Seisakusho Model AEP-100 ellipsometer.

Before the metal is fluorinated, it is preferable to remove the transmuted layer on the metal surface produced during surface machining and to make the surface smooth. As to surface flatness, it is preferable that the surface is polished nearly to the mirror finish where $R_{max}=0.03-1.0$ μm. Here, $R_{max}$ represents the maximum height difference in peaks of surface. According to the studies made by the present inventors, the fluorinated passivation film formed on the mirror finished surface whose $R_{max}$ is nearly 0.03-1.0 μm has been found to have excellent corrosion-resistance as compared with that formed on the surface without the mirror finish treatment. The method of the mirror finish treatment itself is a matter of design choice provided that the transmuted layer can be removed completely from the metal surface, and appropriate means can be chosen in various fields. As a typical example, composite electrolytic polishing is available.

Figure 2:
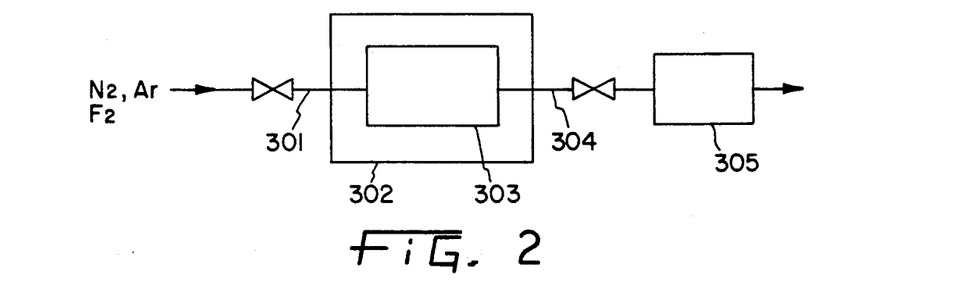
FIG. 2 is a schematic representation illustrating an apparatus for forming the fluorinated 30 passivation film on the wall of a reaction chamber.

FIG. 2 is a schematic representation of one example wherein interior surface of the reaction chamber is passivated. When the reaction chamber 303 is passivated, moisture in the reaction chamber is purged at room temperature by introducing ultra high pure $N_2$ or Ar into the reaction chamber through a gas supply line 301 at a flow rate of, e.g , about 10 1/min. Whether the moisture has been removed or not is confirmed, for example, by monitoring dew point of the purged gas with a dew point meter 305 installed at a purging line 304. After that, $H_2O$ molecules adsorbed by the interior surface of the reaction chamber are removed almost completely by heating the entire reaction chamber 303 to a baking temperature with an electric furnace 302. Then, the fluorination of the interior surface of the reaction chamber is carried out by introducing a high purity gas of $F_2$. After the fluorination for a prescribed period, ultra high pure $N_2$ or Ar is again introduced into the chamber in order for the $F_2$ gas remaining in the chamber to be purged. Even after purging is completed, ultra high pure $N_2$ or Ar is allow to keep flowing and the fluorinated passivation film is annealed. The fluorinated passivation film thus formed is extremely stable to a corrosive gas.

The W film forming apparatus can be fabricated by using the above-mentioned metal materials which have already been fluorinated. It is also possible to manufacture the apparatus by forming the fluorinated passivation film on a metal surface after the apparatus is assembled. The fluorination is carried out under the conditions mentioned above.

By adopting the structure described above, the corrosion caused by $WF_6$ and the release of the gas from the surface of the reaction chamber can be prevented. Namely, the $WF_6$ gas and the surface of the substrate and the film can be prevented from being contaminated As a result, a high quality W film can be deposited selectively only on the Si surface. The apparatus of the present invention has excellent corrosion-resistance not only to $WF_6$ but also to HF, which is generated as a result of the following reaction:

$$WF_6 + 3H_2 \rightarrow W + 6HF$$

Because HF has as a property that it removes a natural oxidation film, even if the $SiO_2$ film is formed on the Si surface, the $SiO_2$ films will be removed immediately. Therefore, the surface of Si is maintained clean at the initial stage of deposition.

The portion of an $H_2$ gas introducing means which is to be in contact with $H_2$ gas is preferably constructed of material which will not release gas from its surface. It is preferable for such portion to be made of stainless steel whose surface is covered with the oxidized passivation film which will be discussed later, or metal materials whose surface is covered with the fluorinated passivation film, the same materials as those used for the reaction chamber.

The stainless steel on which the thermal oxidation passivation film is formed is described in Japan patent application Sho 63-5389. One example is described as follows; the stainless steel having the oxidized passivation film which has a thickness of more than 50 Å and is composed of two layers of Cr oxides and Fe oxides, and is prepared by heating and oxidizing stainless steel such as SUS 316L at a temperature from 400° to 500° C.

The means for introducing $WF_6$ and $H_2$ gases into the reaction chamber are separately connected to the reaction chamber. It is also possible to connect these two means to a gas mixer and then to connect the gas mixer to the chamber through other appropriate means.

It is preferable to attach the means for introducing $F_2$ gas into the reaction chamber in addition to the means for introducing $WF_6$ and $H_2$. The following effects are expected by attaching this means.

1) During the deposition of the W film, if $F_2$ gas whose concentration is, for example, 0.01-0.1% is introduced into the reaction chamber, $F_2$ will react with the W atoms drifting above the insulating film region, as shown in the equation:

$$W + 3F_2 \rightarrow WF_6 \ldots \quad (5)$$

Therefore, undesirable W atoms are removed from the region over the insulating film, and nucleation and growth of the W on the insulating film are inhibited. In other words, the high selectivity which allows W to be deposited only on the Si surface is attained.

2) While the deposition is not being carried out, it is possible according to equation (3) to remove the W deposits adhering to the interior wall of the reaction chamber by introducing 100% $F_2$ gas into the chamber. In the prior art, however, $F_2$ can not be introduced into the chamber because the $F_2$ corrodes the interior wall of the chamber as well as tungsten. Therefore, when the interior wall is covered with W deposits, the chamber must be opened and the W deposits must be manually removed. This operation causes downtime of the apparatus with a subsequent reduction in the efficiency of the operation. Furthermore, being exposed to the atmosphere, the interior surface of the chamber adsorb moisture gas and particles. As a result, it takes a lot of time to remove these impurities. In contrast, it has become possible with the present invention to introduce $F_2$ into the chamber because the interior walls of the reaction chamber are corrosion-resistant to $F_2$. Therefore, the removal of W deposits adhering to the wall without the chamber being exposed to the atmosphere, i.e. self cleaning, can be carried out.

When self cleaning as described above is carried out, it is preferable to heat the whole reaction chamber uniformly with means installed for heating the whole reaction chamber because the W deposits adhering to the wall can be removed swiftly and uniformly. As a heating means, for example, the following device is available: the device in which the whole reaction chamber is surrounded by a water jacket, and mineral oil heated to a prescribed temperature is made to flow into the water jacket.

In the case of using $WF_6$ gas free from moisture, the stainless steel with the oxidized passivation film can be used for the means introducing $WF_6$ because this $WF_6$ gas is not as corrosive as the $WF_6$ gas containing moisture. Obviously, the metal materials with the fluorinated passivation film of the present invention can be used. In this case, the W film which has excellent properties (for example, very low contact resistivity) is reliably reproduced. Even if $WF_6$ gas is mixed with moisture by the accident such as by an erroneous operation, the means introducing WF6 will not be corroded and secondary contamination can be prevented.

As for a means to introduce $F_2$ gas, the portion in contact with $F_2$ is, at least, made of stainless steel on which the oxidized passivation film is formed, or metal materials with the fluorinated passivation film.

In the apparatus of the present invention, valves, regulators, and/or filters can be installed at appropriate positions, if necessary. Those portion of these devices which are to be in contact with gases are made up of the stainless steel whose surface was oxidized to form the oxidized passivation film, or metal materials with the fluorinated passivation film of this invention. The portions of these devices which are to be in contact with gases are, in particular, desired to be polished to a mirror finish (where, surface roughness within any circle with radius of 5 μm is $R_{max}=1.0$ μm max, and moreover $R_{max}=0.03-0.5$ μm is preferable) by the method such as an electrolytic polishing because the corrosion-resistance property is improved much more, the amount of leakage decreases remarkably, and the amount of released gas decreases.

Unreacted $WF_6$ gas is, for example, treated and disposed of as follows. A copper or nickel column packed with pelletized NaCl is installed downstream of the reaction chamber and a washing column is installed downstream of the copper or nickel column, wherein waste gas is washed with a 10% NaOH aqueous solution. When the waste gas of $WF_6$ is introduced into the column together with $F_2$ gas, $WF_6$ is replaced with $Cl_2$ according to the following reactions $$WF_6 + 2NaCl \rightarrow Na_2WF_6Cl_2$$

$$Na_2WF_6Cl_2 + F_2 \rightarrow Na_2WF_8 + Cl_2$$

The $Cl_2$ gas reacts with the NaOH solution at the washing column, producing NaCl, and the removal of $WF_6$ is completed. Even for this reason, it is also useful to attach the $F_2$ introducing means to the reaction chamber.

DESCRIPTION OF THE PREFERRED EMBODIMENTS

Embodiment 1

A polished plate of SUS-316L ( a surface flatness $R_{max}=0.03-1.0$ μm) was fluorinated in 100% $F_2$ atmosphere at various temperatures between 150° and 305° C. for 2 hours, after having been baked in ultra high purity environment of $N_2$ gas, the impurity content of the $N_2$ gas being less than several ppb, at 350° C. for 2 hours. Thereafter the plates were annealed for 2 hours at 300° C. in ultra high purity atmosphere of inert gas, the impurity content being less than several ppb. The thickness of the fluorinated passivation films formed at various temperatures is listed in Table 1. Cracking and flaking off were observed in the fluorinated passivation film formed at 305° C.

TABLE 1

| Film forming temperature (°C.) | 150 | 200 | 250 | 305 |
|---|---|---|---|---|
| Film thickness (Å) | 500 | 1040 | 2250 | 4100 |

The result of ESCA and X-ray diffraction analyses on these films showed that there existed a two-layer fluorinated passivation film which was composed of the Cr fluoride layer located away from the metal surface and Fe fluoride layer which is in contact with metal surface, and that these metal fluorides indicated by $FeF_{2.0}$ and $CrF_{2.0}$ were almost stoichiometric amount.

Figure 3:
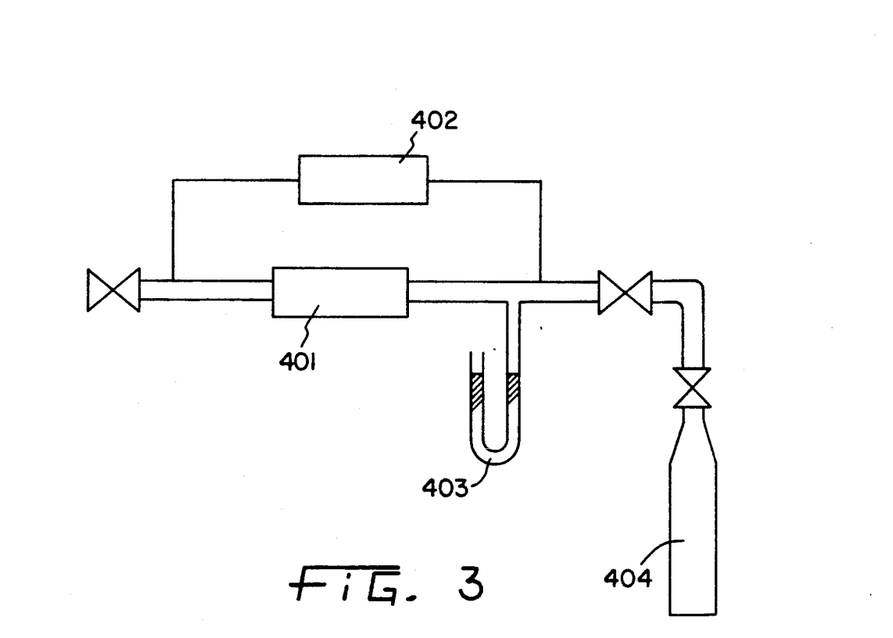
FIG. 3 is a schematic representation showing an apparatus for evaluating the corrosion-resistance properties.

Next, the corrosion-resistance characteristic to $WF_6$ was evaluated. The evaluation was made on the basis of the amount of reacted WF6 which was obtained in a following way: SUS-316L tubes of ¼ inches diameter, each of which had a different thickness of the fluorinated passivation film, were left at 100° C. for 1 hour after admitting WF6 gas containing 0.1 % moisture. The amount of the reacted $WF_6$ gas was calculated from the difference between the pressures just after and one hour after gas was admitted. FIG. 3 is a schematic representation illustrating an apparatus used for the evaluation of the passivation films. In FIG. 3, 401 is a SUS 316L ¼ inches electrolytically polished tube, 402 is a heating means (DC heating); 403 is a mercury manometer; 404 is a gas cylinder. The results are summarized in Table 2.

TABLE 2

| passivation film thickness (Å) | amount of reacted $WF_6$ gas μg/cm² | |
| --- | --- | --- |
| | after anneal | before anneal |
| 0 | 5.0 | 5.0 |
| 400 | 2.0 | 3.0 |
| 660 | 0 | 1.0 |
| 1040 | 0 | 0.9 |

As is obvious from Table 2, the metal materials subjected to the annealing treatment reacted little with $WF_6$ as compared with those metal materials which had not been annealing treatment. In particular, the metal materials with the almost stoichiometric fluorinated passivation film of 660 Å or more in thickness did not react with $WF_6$ at all.

Next, the corrosion-resistance characteristic of the fluorinated passivation film to the HF gas containing moisture, which is remarkably corrosive, were examined. The result is listed in Table 3. The evaluation was made on the SUS 316L tube of ¼ inches diameter by examining the extent of corrosion in the interior wall, having the passivation film of various thickness, after the tubes were put into with the gas of composition described below and left at 25° C. for 72 hours. No corrosion was observed for the tubes which had a fluorinated passivation films of 660 and 1040 Å thickness. The gas composition used in the experiment was as follows: HF, 5.0; $H_2O$, 1.0; $N_2$, 94 in vol %.

TABLE 3

| passivation film thickness(Å) | corrosion-resistance characteristics | |
| --- | --- | --- |
| | after anneal | before anneal |
| 0 | x | x |
| 400 | | x |
| 660 | | |
| 1040 | | | x : extensive corrosion,
: some corrosion was observed,
: slight corrosion was observed,
: no corrosion was observed.

Next, the gas releasing characteristic of the fluorinated passivation film was evaluated. The sample tube used for experiment was a SUS 316L tube of ¼ inches diameter and 1 m length. In order to make the adsorption condition of moisture equal for every tube, the sample tubes had been left for 72 hours in a clean room where the temperature and humidity is kept at 25° C. and 50%, respectively before the experiment was carried out. The evaluation was made by measuring the moisture content in the $N_2$ gas after having passed through the tube by use of a dew point meter. Here, a high purity $N_2$, its moisture content being less than 0.1 ppm in volume, was flowed inside the tube at a rate of 500 cc/min.

Figure 4:
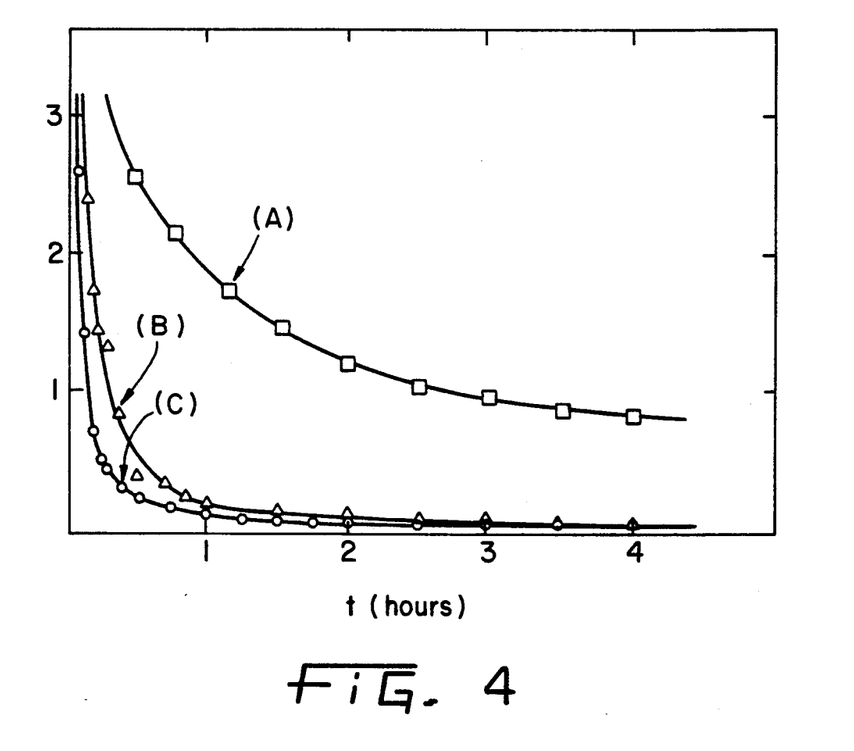
FIG. 4 is a graph showing a gas releasing characteristic from the fluorinated passivation film.

FIG. 4 shows the results of the experiment carried out at room temperature. FIG. 4 shows the results for the tube which was electrolytically polished (B), the tube which was, furthermore, fluorinated by F2 gas at 200° C. for 2 hours(A), and the tube which was annealed in inert gas at 300° C. for 2 hours after fluorination(C).

It is apparent from FIG. 4 that although the tube (A), which was just fluorinated, does not show a good moisture releasing characteristic, the tube (C), which was annealed after fluorination, shows an excellent characteristic.

Next, a reaction chamber was fabricated by using the metal materials on which the fluorinated passivation film of 660 Å in thickness, composed of an almost stoichiometric metal fluoride, was formed. This reaction chamber was separately connected to the means for introducing $WF_6$, $H_2$, and $F_2$ gases. The means for introducing gas are the gas introducing tubes wherein a thermally oxidized passivation film is formed on the surface of stainless steel tube having a surface flatness equal to or less than 0.5 μm. Here, the valves, regulators, and filters were attached to appropriate positions of the gas introducing tubes. The portions of valves, regulators, and filters which are to be in contact with introduced gases were constructed of stainless steel, whose surface has a flatness $R_{max}$ equal to or less than 0.5 μm and the thermal oxidation passivation film was formed on in a similar manner as for the gas introducing tubes.

By using the apparatus fabricated as mentioned above, the deposition of the W film was carried out on the Si substrate according to the following procedure.

The Silicon substrate was placed in the reaction chamber. Then, the reaction chamber and the piping system were purged by ultra high purity $N_2$ gas at a flow rate of 10 l/min. Here, the Si substrate used was the one that had the same structure as that shown in FIG. 1 and in which the diameter of contact hole was 0.5 μm. After the chamber was purged by the $N_2$ gas, $WF_6$, $H_2$, and $F_2$ gases were introduced separately to the chamber, and then the film formation of W was begun. The film forming condition was as follows:

| $WF_6$ flow rate | 10–20 sccm, |
| --- | --- |
| $H_2$ flow rate | 500 sccm, |
| $F_2$ flow rate | 0.1–0.2 sccm, |
| pressure | 0.1–0.2 torr, |
| temperature | 150–200° C. |

The gases of $WF_6$ and $H_2$ used were free from moisture.

After the deposition, a self cleaning of the reaction chamber was carried out by stopping supply of the $WF_6$ and $H_2$ gases, and by introducing only $F_2$ gas.

From the examination of the substrate after film deposition, it was found that W was deposited only on the Si surface located inside the contact holes and was not deposited on the $SiO_2$ film. The measurement of the contact resistivity between the W film and the n+ region indicated very low value of $10^{-8}$–$10^{-9}$ ohm/cm² in the case of this embodiment.

Furthermore, neither W deposits on the interior wall nor corrosion of the wall was observed.

Embodiment 2

A Ni film of 4000 Å in thickness was formed on a quartz substrate and a SUS 316L substrate ( a surface flatness $R_{max}$=0.03-1.0 μm ) by a method of sputtering. Then, the surface of Ni film was fluorinated in 100% $F_2$ for 1-5 hours after having been baked in ultra high purity atmosphere of $N_2$ gas at 500° C. for one hour. Thereafter these plates were annealed in inert gas at 500° C. for 2 hours. The thickness of the films formed at various fluorination temperatures is shown in Table 4. The crystal grain boundary, cracking, or flaking off has not been observed in the passivation films formed at various fluorination temperatures on Ni films which had been formed by a sputtering method on an SUS 316L plate and a quartz plate.

TABLE 4

| Film formation Temperature (°C.) | 200 | 300 | 400 |
|---|---|---|---|
| Film Thickness (Å) Quart substrate | 50 | 300 | 1800 |
| Film Thickness (Å) SUS316L substrate | 80 | 350 | 1900 |

From the analyses with ESCA and X-ray diffraction, the passivation film thus obtained was found to have a composition of $NiF_{2.0}$, indicating that nickel fluoride was an almost stoichiometric amount.

The corrosion-resistance characteristic to $WF_6$ was evaluated in the similar way as in the embodiment 1. The result is listed in Table 5.

TABLE 5

| Passivation Film thickness (Å) | Amount of reacted $WF_6$ gas μg/cm$^2$ | |
|---|---|---|
| | after anneal | before anneal |
| 0 | 4.0 | 4.0 |
| 50 | 3.5 | 3.5 |
| 200 | 0 | 1.0 |
| 750 | 0 | 0.7 |

As is apparent from the table, the amount of the reacted $WF_6$ is a little for the metal materials with annealing treatment, showing excellent corrosion-resistance. For metal materials with the film of 200 Å or more in thickness, the amount of reaction was not observed and excellent corrosion-resistance was recognized.

The metal material with the film of 200 Å or more in thickness was also had excellent corrosion-resistant to the HF gas.

In the similar manner as shown in the embodiment 1, the film forming apparatus was fabricated by using the metal materials with the annealed passivation film of 200 Å in thickness, and then the film formation of W was made with this apparatus.

Similarly, as in the embodiment 1, the W film was formed only on the Si surface located inside of the contact holes, and the contact resistivity was $10^{-8}$-$10^{-9}$ ohm/cm$^2$.

The self cleaning of the reaction chamber was also carried out satisfactorily in a similar manner as in the embodiment 1.

Embodiment 3

A polished plate of Hastelloy C ( Ni51 - Mo19 - Cr17 - Fe6 - W5 in wt % ) which had a surface flatness $R_{max}$ of 0.03-1.0 μm was fluorinated in 100% $F_2$ gas for 1-5 hours and then annealed at 400° C. in inert gas for 2 hours, after having been baked at 500° C. in ultra high purity atmosphere of $N_2$ gas for one hour. The thickness of the films formed at various fluorination temperatures is listed in Table 6. Neither cracking nor flaking off was observed in the films which were fluorinated at 200° and 250° C.

TABLE 6

| Film formation temp. (°C.) | 200 | 250 |
|---|---|---|
| Thickness of film (Å) | 1200 | 2100 |

It was found from ESCA and X ray diffraction analyses that the fluorinated passivation film was composed of $NiF_2$., which was an almost stoichiometric amount.

In a similar manner as shown in the embodiment 1, the corrosion-resistance characteristic to $WF_6$ and HF gases was evaluated. The metal material which had a film of 200 Å or more in thickness and was annealed after film formation showed excellent corrosion-resistance to $WF_6$ and HF gases as well as in the cases of the embodiments 1 and 2.

The W film forming apparatus was fabricated by using the metal material which had a fluorinated film of 200 Å in thickness and was annealed, and then the W film was formed with this apparatus in a similar manner as shown in the embodiment 1.

The W film was formed only on the Si surface located inside the contact holes and the contact resistivity was in the range from $10^{-8}$-$10^{-9}$ ohm/cm$^2$. Also, the self cleaning of the reaction chamber was carried out satisfactorily as well as in the embodiment 1.

Embodiment 4

A polished plate of Monel ( Ni66 - Cu29 - Al3 ) which had a surface flatness $R_{max}$ of 0.03-1.0 μm was fluorinated in 100% $F_2$ for 1-5 hours after having been baked at 500° C. in ultra high purity atmosphere of $N_2$ for one hour. The thickness of the films and the film forming temperature are listed in Table 7. Although a slight nonuniformity in film color was observed for the metal material which was fluorinated at 500° C., Neither cracking nor flaking off was observed.

TABLE 7

| Film formation temp. (°C.) | 300 | 400 | 500 |
|---|---|---|---|
| Film thickness (Å) | 1300 | 2100 | 3400 |

It was found from ESCA and X ray diffraction analyses that the fluorinated passivation film was composed of $NiF_2$., which was an almost stoichiometric amount.

In a similar manner as shown in the embodiment 1, the corrosion-resistance characteristic to $WF_6$ and $H_F$ gases was evaluated. The samples which had a film of 200 Å or more in thickness and was annealed after film formation showed excellent corrosion-resistance to $WF_6$ and HF gases as well as in the case of embodiments 1 and 2.

The W film forming apparatus was fabricated by using the metal material which had a fluorinated film of 200 Å in thickness and was annealed, and then the W film was formed with this apparatus in a similar manner as in the embodiment 1.

The W film was formed only on the Si surface located inside the contact holes and the contact resistivity was in the range from $10^{-8}$-$10^{-9}$ ohm/cm$^2$. Also, the self cleaning of the reaction chamber was carried out satisfactorily as well as in the embodiment 1.

Embodiment 5

A polished copper plate which had a surface flatness $R_{max}$ of 0.03-1.0 μm and a SUS-316L substrate on which a copper film of 4000 Å in thickness was formed by a method of sputtering were fluorinated in 100% $F_2$ for 1-5 hours and then annealed at 500° C. in inert gas for 2 hours, after having been baked at 500° C. in ultra high purity atmosphere of $N_2$ for one hour. The thickness of the films formed at various temperatures are listed in Table 8. For the polished copper plates and the sputtered copper films on SUS plates, neither cracking nor flaking off was observed in the passivation film.

TABLE 8

| Film formation temp. (°C.) | 300 | 400 | 500 |
|---|---|---|---|
| Film thickness (Å) polished copper plate | 1500 | 2200 | 3500 |
| Film thickness (Å) sputtered copper | 1600 | 2200 | 3600 |

It was found from ESCA and X ray diffraction analyses that the fluorinated passivation film was composed of an almost stoichiometric copper fluoride indicated by $CuF_{2.0}$.

In a similar manner as shown in the embodiment 1, the corrosion-resistance characteristic to $WF_6$ and HF gases was evaluated. The samples which had a film of 200 Å or more in thickness and were annealed after film formation showed excellent corrosion-resistance to $WF_6$ and HF gases as well as in the case of embodiments 1 and 2.

The W film forming apparatus was fabricated by using the metal material which had a fluorinated film of 200 Å in thickness and was annealed, and then the W film was formed with this apparatus in a similar manner as shown in the embodiment 1.

The W film was formed only on the Si surface located inside the contact holes and the contact resistivity was in the range from $10^{-8}$–$10^{-9}$ ohm/cm$^2$. Also, the self cleaning of the reaction chamber was carried out satisfactorily as well as in the embodiment 1.

Embodiment 6

A Cr film of 4000 Å in thickness was formed on a SUS 316L substrate by a method of sputtering. Then, the surface of Cr film was fluorinated in 100% $F_2$ for 1-5 hours after having been baked in ultra high purity atmosphere of $N_2$ gas at 500° C. for one hour. Thereafter these substrates were annealed in inert gas at 500° C. for 2 hours. The thickness of the films formed at various fluorination temperatures is shown in Table 9. Neither Cracking nor flaking was observed in any passivation film formed at various temperatures.

TABLE 9

| Film formation temp. (°C.) | 300 | 400 | 500 |
|---|---|---|---|
| Film thickness (Å) | 1500 | 2200 | 3500 |

It was found from ESCA and X ray diffraction analyses that the fluorinated passivation film was composed of an almost stoichiometric chromium fluoride indicated by $CrF_{2.0}$.

In a similar manner as shown in the embodiment 1, the corrosion-resistance characteristic to $WF_6$ and HF gases was evaluated. The samples which had a film of 200 Å or more in thickness and was annealed after film formation showed excellent corrosion-resistance to $WF_6$ and HF gases as well as in the case of embodiments 1 and 2.

The W film forming apparatus was fabricated by using the metal material which had a fluorinated film of 200 Å in thickness and was annealed, and then the W film was formed with this apparatus in a similar manner as shown in the embodiment 1.

The W film was formed only on the Si surface located inside the contact holes and the contact resistivity was in the range from $10^{-8}$–$10^{-9}$ ohm cm$^2$. Also, the self cleaning of the reaction chamber was carried out satisfactorily as well as in the embodiment 1.

Embodiment 7

Polished plates of aluminum and aluminum alloy which had a surface flatness $R_{max}$ of 0.03-1.0 μm and an aluminum film of 2000 Å in thickness formed on a SUS-316L substrate by a method of sputtering were fluorinated in 100% $F_2$ for 1-5 hours and then annealed at 350° C. in inert gas for 2 hours, after having been baked at 300° C. in ultra high purity atmosphere of $N_2$ for one hour. The thickness of the films formed at various fluorination temperature are listed in Table 10. For the polished aluminum plates, aluminum alloy plates, and the sputtered aluminum films on SUS plates, the crystal grain boundary, cracking or flaking off was not observed in the passivation film.

TABLE 10

| Film formation temp. (°C) | 250 | 300 |
|---|---|---|
| Film thickness (Å) polished Al plate(#1050) | 450 | 600 |
| Film thickness (Å) polished Al plate(#3003) | 500 | 750 |
| Film thickness (Å) polished Al plate(#5052) | 550 | 800 |
| Film thickness (Å) sputtered Al | 700 | 1100 |

It was found from ESCA and X ray diffraction analyses that the fluorinated passivation film was composed of an almost stoichiometric aluminum fluoride indicated by $AlF_{3.0}$.

In the case of aluminum and aluminum alloy, a lower fluorination temperature was preferable. The film which was formed at a temperature 50 through 150 for time long enough to be fluorinated and annealed showed better corrosion-resistance than those formed at high temperature.

In a similar manner as shown in the embodiment 1, the corrosion-resistance characteristic to $WF_6$ and HF gases was evaluated. The samples which had a film of 200 Å or more in thickness and was annealed after film formation showed excellent corrosion-resistance to $WF_6$ and HF gases as well as in the case of embodiments 1 and 2.

The W film forming apparatus was fabricated by using the metal materials plate which had a fluorinated film of 200 Å in thickness and was annealed, and then the W film was formed with this apparatus in a similar manner as shown in the embodiment 1.

The W film was formed only on the Si surface located inside the contact holes and the contact resistivity was in the range from $10^{-8}$–$10^{-9}$ ohm/cm$^2$. Also, the self cleaning of the reaction chamber was carried out satisfactorily as well as in the embodiment 1.

Embodiment 8

A polished plate of Brass (Cu70- Zn30) which had a surface flatness $R_{max}$ 0.03-1.0 μm was fluorinated in 100% $F_2$ gas for 1-5 hours and then annealed at 350° C. in inert gas for 2 hours, after being baked at 300° C. in ultra high purity atmosphere of $N_2$ gas for one hour. The thickness of the films formed at various temperatures is listed in Table 11. Neither cracking nor flaking was observed in the films fluorinated at both temperatures.

TABLE 11

| Film formation temp. (°C.) | 200 | 250 |
|---|---|---|
| Thickness of film (Å) | 850 | 1200 |

It was found from ESCA and X ray diffraction analyses that the fluorinated passivation film was composed of am almost stoichiometric copper fluoride indicated by $CuF_{2.0}$.

In a similar manner as shown in the embodiment 1, the corrosion-resistance characteristic to $WF_6$ and HF gases was evaluated. The metal material which had a film of 200 Å or more in thickness and was annealed after film formation showed excellent corrosion-resistance to $WF_6$ and HF gases as well as in the case of embodiments 1 and 2.

The W film forming apparatus was fabricated by using the metal material which had a fluorinated film of 200 Å in thickness and was annealed, and then the W film was formed with this apparatus in a similar manner as shown in the embodiment 1.

The W film was formed only on the Si surface located inside the contact holes and the contact resistivity was in the range from $10^{-8}-10^{-9}$ ohm/cm$^2$. Also, the self cleaning of the reaction chamber was carried out satisfactorily as well as in the embodiment 1.

Embodiment 9

In this embodiment, the portions of a $WF_6$ gas introducing tube, a $F_2$ gas introducing tube, valves, regulators, and filters, which were to be in contact with $WF_6$ or HF gases were made of the metal material, the surface of which was the fluorinated passivation film of 660 Å in thickness. The other constitutions of the apparatus were the same as those shown in the embodiment 1.

The W film was formed with this apparatus in the same way as shown in the embodiment 1, which led the result that remarkably excellent characteristic such as the contact resistivity of $10^{-9}$ ohm/cm$^2$, could be reliably obtained.

Application To Industries

By the present invention, it becomes possible to deposit at a low temperature a high quality tungsten film whose contact resistivity is very low on the silicone substrate. In the case that there are contact holes on the Si substrate, it also becomes possible to deposit the W film only on the Si surface located inside the contact holes with high selectivity.

By attaching the means to introduce $F_2$ to the reaction chamber, the removal of the W deposits adhering to the interior wall can be carried out without the interior wall being exposed to the atmosphere; as a result, the efficiency in the operation of the apparatus is remarkably increased.

What is claimed is:

1. A tungsten film forming apparatus comprising a reaction chamber, means for introducing $WF_6$ gas to said reaction chamber and including a container of $WF_6$ gas, and means for introducing $H_2$ gas to said reaction chamber and including a container of $H_2$ gas, wherein at least the portion of said reaction chamber which is to be in contact with $WF_6$ is made of a metal material having a fluorinated passivation film comprising a substantially stoichiometric metal fluoride on the surface.

2. A tungsten film forming apparatus according to claim 1 including means for introducing $F_2$ gas to said reaction chamber.

3. A tungsten film forming apparatus according to claim 1 wherein at least the portion of said $WF_6$ introducing means which is to be in contact with $WF_6$ gas is made of a stainless steel having an oxidized passivation film on the surface.

4. A tungsten film forming apparatus according to claim 1 wherein at least the portion of said $WF_6$ gas introducing means which is to be in contact with $WF_6$ is made of the metal materials having the fluorinated passivation film comprising a substantially stoichiometric metal fluoride on the surface.

5. A tungsten film forming apparatus according to claim 2 wherein at least the portion of a $F_2$ introducing means which is to be in contact with $F_2$ is made of a stainless steel having the oxidized passivation film on the surface.

6. A tungsten film forming apparatus according to claim 2 wherein at least the portion of the $F_2$ introducing means which is to be in contact with $F_2$ is made of a metal material having the fluorinated passivation film comprising a substantially stoichiometric metal fluoride on the surface.

7. A tungsten film forming apparatus according to claim 1 including valves, regulators and/or filters, wherein the portion to be in contact with flowing gases is made of a stainless steel having the oxidation passivation film on the surface.

8. A tungsten film forming apparatus according to claim 1 including valves, regulators and/or filters, wherein the portion to be in contact with flowing gases is made of metal materials having the fluorinated passivation film comprising a substantially stoichiometric metal fluoride on the surface.

9. A tungsten film forming apparatus according to claim 2 including means for heating the whole of said reaction chamber.

10. A tungsten film forming apparatus according to claim 1 wherein the fluorinated passivation film is formed on the surface having a flatness $R_{max}$ of 0.03–1.0 μm 11. A tungsten film forming apparatus according to claim 1 wherein metal materials are stainless steel, nickel, nickel alloy, aluminum, aluminum alloy, copper, copper alloy, chromium, cobalt, cobalt alloy, titan, and titan alloy.

12. A tungsten film forming apparatus according to claim 1 wherein a surface flatness $R_{max}$ is in the range from 0.03–1.0 μm within any circle having radius of 5 μm.

13. A tungsten film forming apparatus according to claim 2 wherein at least the portion of said $WF_6$ introducing means which is to be in contact with $WF_6$ gas is made of a stainless steel having an oxidized passivation film on the surface.

14. A tungsten film forming apparatus according to claim 2 wherein at least the portion of said $WF_6$ gas introducing means which is to be in contact with $WF_6$ is made of the metal materials having the fluorinated passivation film comprising a substantially stoichiometric metal fluoride on the surface.

15. A tungsten film forming apparatus according to claim 6 including valves, regulators and/or filters, wherein the portion to be in contact with flowing gases is made of a stainless steel having the oxidation passivation film on the surface.

16. A tungsten film forming apparatus according to claim 6 including valves, regulators and/or filters, wherein the portion to be in contact with flowing gases is made of metal materials having the fluorinated passivation film comprising a substantially stoichiometric metal fluoride on the surface.

17. A tungsten film forming apparatus according to claim 8 including means for heating the whole of said reaction chamber.

18. A tungsten film forming apparatus according to claim 4 wherein the fluorinated passivation film is formed on the surface having a flatness $R_{max}$ of 0.03–1.0 μm 19. A tungsten film forming apparatus according to claim 4 wherein metal materials are stainless steel, nickel, nickel alloy, aluminum, aluminum alloy, copper, copper alloy, chromium, cobalt, cobalt alloy, titan, and titan alloy.

20. A tungsten film forming apparatus according to claim 4 wherein a surface flatness $R_{max}$ is in the range from 0.03–1.0 μm within any circle having radius of 5 μm.

* * * * *